United States Patent
Graff et al.

(10) Patent No.: US 6,923,702 B2
(45) Date of Patent: Aug. 2, 2005

(54) METHOD OF MAKING ENCAPSULATED DISPLAY DEVICES

(75) Inventors: Gordon Lee Graff, West Richland, WA (US); Peter Maclyn Martin, Kennewick, WA (US); Mark Edward Gross, Pasco, WA (US); Ming Kun Shi, Castro Valley, CA (US); Michael Gene Hall, West Richland, WA (US); Eric Sidney Mast, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 55 days.

(21) Appl. No.: 10/318,759

(22) Filed: Dec. 13, 2002

(65) Prior Publication Data

US 2003/0104753 A1 Jun. 5, 2003

Related U.S. Application Data

(60) Division of application No. 09/553,187, filed on Apr. 20, 2000, now Pat. No. 6,573,652, which is a continuation-in-part of application No. 09/427,138, filed on Oct. 25, 1999, now Pat. No. 6,522,067.

(51) Int. Cl.⁷ .............................................. H05B 33/00
(52) U.S. Cl. ........................................ 445/24; 445/50
(58) Field of Search .............................. 445/24, 25, 50, 445/51; 313/504–506

(56) References Cited

U.S. PATENT DOCUMENTS

| | | | |
|---|---|---|---|
| 3,475,307 A | 10/1969 | Knox et al. | |
| 3,607,365 A | 9/1971 | Lindlof | |
| 4,098,965 A | 7/1978 | Kinsman | |
| 4,266,223 A | * 5/1981 | Frame | 345/80 |
| 4,283,482 A | 8/1981 | Hattori et al. | |
| 4,581,337 A | 4/1986 | Frey et al. | |
| 4,624,867 A | 11/1986 | Iijima et al. | |
| 4,695,618 A | 9/1987 | Mowrer | |
| 4,768,666 A | * 9/1988 | Kessler | 215/232 |
| 4,842,893 A | 6/1989 | Yializis et al. | |
| 4,954,371 A | 9/1990 | Yializis | |
| 5,032,461 A | 7/1991 | Shaw et al. | |
| 5,036,249 A | 7/1991 | Pike-Biegunski et al. | |
| 5,059,861 A | * 10/1991 | Littman et al. | 313/503 |
| 5,124,204 A | 6/1992 | Yamashita et al. | |
| 5,189,405 A | 2/1993 | Yamashita et al. | |

(Continued)

FOREIGN PATENT DOCUMENTS

| | | |
|---|---|---|
| BE | 704 297 | 2/1968 |
| DE | 19603746 | 4/1997 |
| EP | 0 299 753 | 1/1989 |

(Continued)

OTHER PUBLICATIONS

Affinito, J D et al., "PML/Oxide/PML barrier layer performance differences arising from use of UV or electron beam polymerization of the PML layers" Thin Solid Films, Elsevier Science, S.A., Vo. 308–309, Oct. 31, 1997, pp. 19–25.

(Continued)

*Primary Examiner*—Joseph Williams
(74) *Attorney, Agent, or Firm*—Dinsmore & Shohl LLP

(57) ABSTRACT

An encapsulated display device. The device includes a substrate, an environmentally sensitive display device adjacent to the substrate, and at least one first barrier stack adjacent to the environmentally sensitive display device. The barrier stack encapsulates the environmentally sensitive display device. It includes at least one first barrier layer and at least one first polymer layer. The encapsulated display device optionally includes at least one second barrier stack located between the substrate and the environmentally sensitive display device. The second barrier stack includes at least one second barrier layer and at least one second polymer layer. A method for making an encapsulated display device is also disclosed.

25 Claims, 1 Drawing Sheet

U.S. PATENT DOCUMENTS

| | | | |
|---|---|---|---|
| 5,237,439 A | 8/1993 | Misono et al. | |
| 5,260,095 A | 11/1993 | Affinito | |
| 5,354,497 A | 10/1994 | Fukuchi et al. | |
| 5,395,644 A | 3/1995 | Affinito | |
| 5,427,638 A | 6/1995 | Goetz et al. | |
| 5,440,446 A | 8/1995 | Shaw et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,607,789 A | 3/1997 | Treger et al. | |
| 5,620,524 A | 4/1997 | Fan et al. | |
| 5,629,389 A | 5/1997 | Roitman et al. | |
| 5,654,084 A | 8/1997 | Egert | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,711,816 A | 1/1998 | Kirlin et al. | |
| 5,725,909 A | 3/1998 | Shaw et al. | |
| 5,731,661 A | 3/1998 | So et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,771,562 A | 6/1998 | Harvey, III et al. | |
| 5,792,550 A | 8/1998 | Phillips et al. | |
| 5,811,177 A | 9/1998 | Shi et al. | |
| 5,811,183 A | 9/1998 | Shaw et al. | |
| 5,821,692 A | 10/1998 | Rogers et al. | |
| 5,844,363 A | 12/1998 | Gu et al. | |
| 5,872,355 A | 2/1999 | Hueschen | |
| 5,902,641 A | 5/1999 | Affinito et al. | |
| 5,902,688 A | 5/1999 | Antoniadis et al. | |
| 5,904,958 A | 5/1999 | Dick et al. | |
| 5,912,069 A | 6/1999 | Yializis et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,952,778 A | 9/1999 | Haskal et al. | |
| 5,965,907 A | 10/1999 | Huang et al. | |
| 5,996,498 A | 12/1999 | Lewis | |
| 6,045,864 A | 4/2000 | Lyons et al. | |
| 6,083,313 A | 7/2000 | Venkatraman et al. | |
| 6,083,628 A | 7/2000 | Yializis | |
| 6,084,702 A | 7/2000 | Byker et al. | |
| 6,146,225 A | 11/2000 | Sheats et al. | |
| 6,150,187 A * | 11/2000 | Zyung et al. | 438/26 |
| 6,195,142 B1 * | 2/2001 | Gyotoku et al. | 349/69 |
| 6,198,217 B1 | 3/2001 | Suzuki et al. | |
| 6,268,695 B1 | 7/2001 | Affinito | |
| 6,413,645 B1 | 7/2002 | Graff et al. | |
| 6,522,067 B1 * | 2/2003 | Graff et al. | 313/512 |
| 6,573,652 B1 * | 6/2003 | Graff et al. | 313/512 |
| 2002/0125822 A1 | 9/2002 | Graff et al. | |

FOREIGN PATENT DOCUMENTS

| | | |
|---|---|---|
| EP | 0 340 935 | 11/1989 |
| EP | 0 390 540 | 10/1990 |
| EP | 0 547 550 | 6/1993 |
| EP | 0 590 467 | 4/1994 |
| EP | 0 722 787 | 7/1996 |
| EP | 0 777 280 | 6/1997 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |
| JP | 64-18441 | 1/1989 |
| JP | 2-183230 | 7/1990 |
| JP | 08325713 | 12/1996 |
| JP | 09059763 | 3/1997 |
| JP | 10312883 | 11/1998 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |
| WO | WO 00 36665 | 6/2000 |
| WO | WO 00/36665 | 6/2000 |
| WO | WO 01/81649 A1 | 11/2001 |
| WO | WO 01/82336 A2 | 11/2001 |
| WO | WO 01/82389 A1 | 11/2001 |
| WO | WO 01/89006 A1 | 11/2001 |

OTHER PUBLICATIONS

Notification of Transmittal of the International Search Report or the Declaration, Mar. 3, 2000, PCT/US99/29853.

Gustaffson, G et al., "Flexible light–emitting diodes made from soluble conducting polymers", Nature, vol. 35, Jun. 11, 1992, pp. 447–479.

Affinito, J D et al., "Polymer–Oxide Transparent Barrier Layers", SVC 39th Annual Technical Conference, Vacuum Web Coating Session, 1996, pp. 392–397.

Affinito, J D et al., "PML/Oxide/PML Barrier Layer Performance Differences Arising from Use of UV or Electron Beam Polymerization of the PML Layers", SVC 40th Annual Technical Conference 1997 pp. 19–25.

Affinito, J D, et al., "Vacuum Deposition of Polymer Electrolytes On Flexible Substrates", "Proceedings of the Ninth International Conference on Vacuum Web Coating", Nov. 1965 ed R. Bakish. Bakish Press 1995. pp. 20–36.

Vossen, J L, et al., Thin Film Processes, Academic Press, 1978, Part II Chapter II–1, Glow Discharge Sputter Deposition, p. 12–63; Part IV, Chapter IV–1 Plasma Deposition of Inorganic Compounds and Chapter IV–2 Glow Discharge Polymerization, pp. 335–397.

Penning, F M, Electrical Discharges in Gasses, Gordon and Breach Science Publishers, 1965, Chapters 5–6, pp. 19–35, and Chapter 8, pp. 41–50.

Affinito, J D et al., "High Rate Vacuum Deposition of Polymer Electrolytes", Journal Vacuum Science Technology A 14(3), May/Jun. 1996.

Inoue et al., Proc. Jpn. Congr. Mater. Res., vol. 33, pp. 177–179, 1990.

Klemberg–Sapieha, J E et al., "Transparent Gas Barrier Coatings Produced by Dual–Frequency PECVD" 36th Annual Technical Conference Proceedings, 1993, pp. 445–449.

Krug, T et al., "New Developments in Transparent Barrier Coatings", 36th Annual Technical Conference Proceedings, 1993, pp. 302–305.

Shaw, D G et al., "Use of Vapor Deposited Acrylate Coatings to Improve the Barrier Properties of Metallized Film", 37th Annual Technical Conference Proceedings, 1994, pp. 240–244.

Hoffmann, G et al., "Transparent Barrier Coatings by Reactive Evaporation", 37th Annual Technical Conference Proceedings, 1994, pp. 155–160.

Kukla, R et al., "Transparent Barrier Coatings with EB–Evaporation, an Update", Thirteenth International Conference on Vacuum Web Coating, 1999, pp. 223–233.

Hibino, N et al., "Transparent Barrier Al2O3 Coating by Activated Reactive Evaporation", Thirteenth International Conference on Vacuum Web Coating, 1999, pp. 234–246.

Henry, B M et al., "Microstructural Studies of Transparent Gas Barrier Colatings on Polymer Substraets", Thirteenth International Conference on Vacuum Web Coatings, 1999, pp. 265–273.

Bright, C I et al., "Transparent Barrier Coatings Based ITO for Flexible Plastic Displays", Thirteenth International Conference on Vacuum Web Coating, 1999, pp. 247–255.

Finson, E et al., "Transparent SiO2 Barrier Coatings: Conversion and Production Status", 37th Annual Technical Conference Proceedings, 1994, pp. 139–143.

Yializis, A, "High Oxygen Barrier Polypropylene Films Using Transparent Acrylate–A2O3 and Opaque Al–Acrylate Coatings", 38th Annual Technical Conference Proceedings, 1995, pp. 95–102.

Yamada, Y et al., "The Properties of a New Transparent and Colorless Barrier Film", 38th Annual Technical Conference Proceedings, 1995, pp. 28–31.

Chahroudi, D, "Transparent Glass Barrier Coatings for Flexible Film Packaging", 34th Annual Technical Conference Proceedings, 1991, pp. 130–133.

Yializis, A et al., "Ultra High Barrier Films", 43rd Annual Technical Conference Proceedings, Denver, Apr. 15–20, 2000, pp. 404–407.

Felts, J T, "Transparent Barrier Coatings Update: Flexible Substrates", 36th Annual Technical Conference Proceedings, 1993, pp. 324–331.

Shi, M K et al., Plasma treatment of PET and acrylic coating surfaces–I. In situ XPS measurements, Journal of Adhesion Science and Technology, Mar. 2000, 14(12), pp. 1–28.

Shi, M K et al., In situ and real–time monitoring of plasma–induced etching PET and acrylic films, Plasmas and Polymers, Dec. 1999, 4(4), pp. 1–25.

Norenberg, H et al. "Comparative Study of Oxygen Permeation Through Polymers and as Barrier Films", 43rd Annual Technical Conference Proceedings, Denver, Apr. 15–20, 2000, pp. 347–351.

Henry, B M et al., "Microstructural and Gas Barrier Properties of Transparent Aluminum Oxide and Indium Tin Oxide Films", 43rd Annual Technical Conference Proceedings, Denver, Apr. 15–20, 2000, pp. 373–378.

Mahon, J K et al., "Requirements of Flexible Substrates for Organic Light Emitting Devices in Flat Panel Display Applications", 42nd Annual Technical Conference Proceedings, 1999, pp. 456–459.

Affinito, J D et al., Vacuum Deposited Conductive Polymer Films. The Eleventh International Conference on Vacuum Web Coating, no earlier than Feb. 1998, pp. 200–213.

Phillips, R W et al., "Evaporated Dielectric Colorless Films on PET and OPP Exhibiting High Barriers Toward Moisture and Oxygen", 36th Annual Technical Conference Proceedings, 1993, pp. 293–301.

* cited by examiner

METHOD OF MAKING ENCAPSULATED DISPLAY DEVICES

CROSS-REFERENCE TO RELATED APPLICATION

This application is a divisional of U.S. patent application Ser. No. 09/553,187, filed Apr. 20, 2000, now U.S. Pat. No. 6,573,652, entitled "Encapsulated Display Devices" which is a continuation-in-part of U.S. application Ser. No. 09/427,138, filed Oct. 25, 1999, now U.S. Pat. No. 6,522,067, entitled "Environmental Barrier Material for Organic Light Emitting Device and Method of Making."

BACKGROUND OF THE INVENTION

The present invention relates generally to display devices, and more particularly to environmentally sensitive display devices encapsulated in barrier stacks to prevent degradation.

There is a need for versatile visual display devices for electronic products of many different types. Many different display devices are presently being used, including liquid crystal displays (LCDs), light emitting diodes (LEDs), light emitting polymers (LEPs), electronic signage using electrophoretic inks, electroluminescent devices (EDs), and phosphorescent devices. Many of these display devices are environmentally sensitive. As used herein, the term environmentally sensitive display device means display devices which are subject to degradation caused by permeation of environmental gases or liquids, such as oxygen and water vapor in the atmosphere or chemicals used in the processing of the electronic product.

Although many current displays use glass substrates, there is a trend toward the use of plastic substrates. Plastic substrates are critical to future generations of electronic products and associated technologies because they are light weight, impact resistant, and cost effective. However, the gas and liquid permeation resistance of plastics is poor, often several orders of magnitude below what is required for sustained device performance. Barrier coatings are applied to substrates to decrease their gas and liquid permeability. Barrier coatings typically consist of single layer thin film inorganic materials, such as Al, $SiO_2$, $Al_2O_3$, and $Si_3N_4$ vacuum deposited on polymeric substrates. The best single layer coatings reduce oxygen and water vapor permeability to levels of about 0.1 to 1.0 $cc/m^2/day$ and about 0.1 to 1.0 $g/m^2/day$, respectively. (Conditions were not reported. The testing is believed to be at 23° C.) However, many displays require oxygen permeability levels of between about $10^{-6}$ and $10^{-5}$ $cc/m^2/day$, and water vapor permeability levels between about $10^{-4}$ and $10^{-2}$ $g/m^2/day$. The environmental sensitivity of the display devices limits the lifetime, reliability, and performance of devices constructed on plastics, which has retarded the development of display devices made with plastic substrates.

Thus, there is a need for an improved, lightweight, barrier construction which can be used to encapsulate environmentally sensitive display devices and prevent the deterioration caused by gas and liquid permeation, and for methods for making such encapsulated environmentally sensitive display devices.

SUMMARY OF THE INVENTION

The present invention meets these need by providing an encapsulated display device and a method for making such a device. The device includes a substrate, an environmentally sensitive display device adjacent to the substrate, and at least one first barrier stack adjacent to the environmentally sensitive display device. By adjacent, we mean next to, but not necessarily directly next to. There can be additional layers intervening between the adjacent layers. The barrier stack encapsulates the environmentally sensitive display device. It includes at least one first barrier layer and at least one first polymer layer. The encapsulated display device optionally includes at least one second barrier stack located between the substrate and the environmentally sensitive display device. The second barrier stack includes at least one second barrier layer and at least one second polymer layer.

Preferably, either one or both of the first and second barrier layers of the first and second barrier stacks is substantially transparent. At least one of the first barrier layers preferably comprises a material selected from metal oxides, metal nitrides, metal carbides, metal oxynitrides, metal oxyborides, and combinations thereof.

Either one of the first and second barrier layers can be substantially opaque, if desired. The opaque barrier layers are preferably selected from opaque metals, opaque polymers, opaque ceramics, and opaque cermets.

The substrate can either be flexible or rigid. It is preferably made of a flexible substrate material, such as polymers, metals, paper, fabric, and combinations thereof. If a rigid substrate is used, it is preferably a ceramic (including glass), a metal, or a semiconductor.

The polymer layers of the first and second barrier stacks are preferably acrylate-containing polymers. As used herein, the term acrylate-containing polymers includes acrylate-containing polymers, methacrylate-containing polymers, and combinations thereof. The polymer layers in the first and/or the second barrier stacks can be the same or different.

The environmentally sensitive display device is preferably selected from liquid crystal displays, displays using electrophoretic inks, light emitting diodes, electroluminescent devices, and phosphorescent devices.

The encapsulated display device can include additional layers if desired, such as polymer smoothing layers, scratch resistant layers, or other functional layers. The encapsulated display device can also include a lid adjacent to the at least one first barrier stack.

The present invention also involves a method of making the encapsulated display device. The method includes providing a substrate having an environmentally sensitive display device thereon, and placing at least one first barrier stack over the environmentally sensitive display device to encapsulate the environmentally sensitive display device. The barrier stack includes at least one first barrier layer and at least one first polymer layer.

The environmentally sensitive display device can be placed on the substrate by deposition or by lamination. The at least one first barrier stack can be placed over the environmentally sensitive display device by deposition, preferably vacuum deposition, or by laminating the barrier stack over the environmentally sensitive device. The lamination can be performed using an adhesive, solder, ultra sonic welding, pressure, or heat.

A second barrier stack can be placed on the substrate before the environmentally sensitive display device is placed there. The second barrier stack includes at least one second barrier layer and at least one second polymer layer. The second barrier stack can be deposited on the substrate, preferably by vacuum deposition.

The substrate can be removed from the encapsulated environmentally sensitive display device, if desired.

Accordingly, it is an object of the present invention to provide an encapsulated display device, and to provide a method of making such as device.

DESCRIPTION OF THE INVENTION

Figure 1:
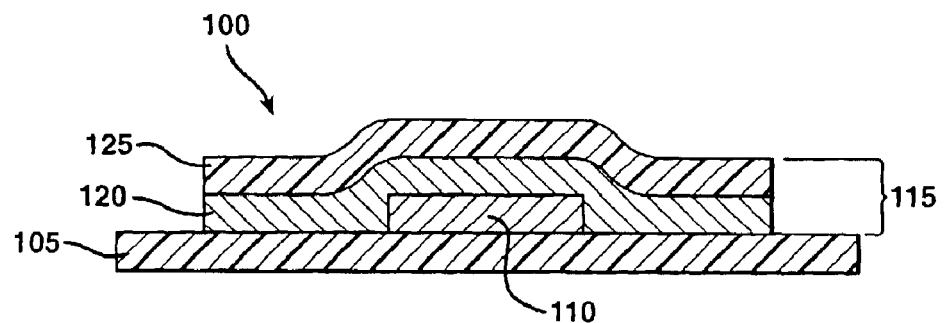
FIG. 1 is a cross-section of one embodiment of the encapsulated display device of the present invention.

One embodiment of the encapsulated display device of the present invention is shown in FIG. 1. The encapsulated display device 100 includes a substrate 105, an environmentally sensitive display device 110, and a first barrier stack 115. The first barrier stack 115 includes a barrier layer 120 and a polymer layer 125. The first barrier stack 115 encapsulates the environmentally sensitive display device 110, preventing environmental oxygen and water vapor from degrading the environmentally sensitive display device.

The substrate 105 can be either rigid or flexible. A flexible substrate can be any flexible material, including, but not limited to: polymers, for example polyethylene terephthalate (PET), polyethylene naphthalate (PEN), or high temperature polymers such as polyether sulfone (PES), polyimides, or Transphan™ (a high glass transition temperature cyclic olefin polymer available from Lofo High Tech Film, GMBH of Weil am Rhein, Germany); metal; paper; fabric; and combinations thereof. Rigid substrates are preferably ceramics, metals, or semiconductors.

The environmentally sensitive display device 110 can be any display device which is environmentally sensitive. Examples of environmentally sensitive display devices include, but are not limited to liquid crystal displays (LCDs), light emitting diodes (LEDs), light emitting polymers (LEPs), electronic signage using electrophoretic inks, electroluminescent devices (EDs), and phosphorescent devices. These display devices can be made using known techniques, such as those described in U.S. Pat. Nos. 6,025,899, 5,995, 191, 5,994,174, 5,956,112 (LCDs); U.S. Pat. Nos. 6,005, 692, 5,821,688, 5,747,928 (LEDs); U.S. Pat. Nos. 5,969, 711, 5,961,804, 4,026,713 (E Ink); U.S. Pat. Nos. 6,023,373, 6,023,124, 6,023,125 (LEPs); and U.S. Pat. Nos. 6,023,073, 6,040,812, 6,019,654, 6,018,237, 6,014,119, 6,010,796 (EDs), which are incorporated herein by reference.

In each barrier stack 115, there can be one or more barrier layers 120 and one or more polymer layers 125. The barrier layers and polymer layers in the barrier stack can be made of the same material or of a different material. The barrier layers are typically in the range of about 100–400 Å thick, and the polymer layers are typically in the range of about 1000–10,000 Å thick.

Although FIG. 1 shows a barrier stack with a single barrier layer and a single polymer layer, the barrier stacks can have one or more polymer layers and one or more barrier layers. There could be one polymer layer and one barrier layer, there could be one or more polymer layers on one side of one or more barrier layers, or there could be one or more polymer layers on both sides of one or more barrier layers. The important feature is that the barrier stack have at least one polymer layer and at least one barrier layer.

There can be additional overcoat layers on top of the barrier stack, such as organic or inorganic layers, planarizing layers, transparent conductors, antireflective coatings, or other functional layers, if desired.

Figure 2:
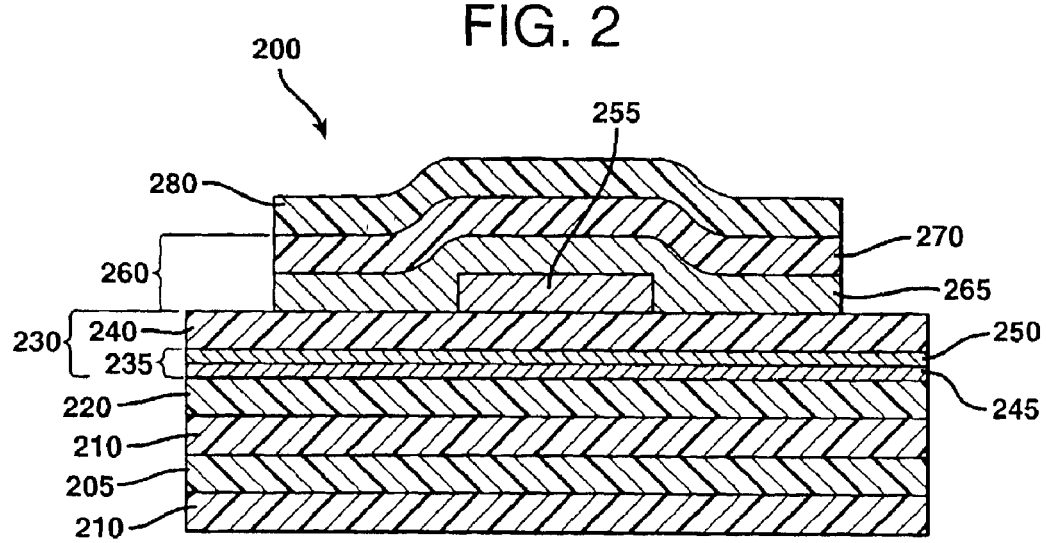
FIG. 2 is a cross-section of an alternate embodiment of the encapsulated display device of the present invention.

A second embodiment of the encapsulated display device of the present invention is shown in FIG. 2. The encapsulated display device 200 has a substrate 205. There are scratch resistant layers 210 on either side of the substrate 205 to protect it. When a scratch resistant layer is included, it is preferred that both sides of the substrate have a scratch resistant layer. This helps to prevent curling of a flexible substrate.

On top of the scratch resistant layer 210, there is a polymer smoothing layer 220. The polymer smoothing layer decreases surface roughness, and encapsulates surface defects, such as pits, scratches, and digs. This produces a planarized surface which is ideal for deposition of subsequent layers. Depending on the desired application, there can be additional layers deposited on the substrate 205, such as organic or inorganic layers, planarizing layers, electrode layers, antireflective coatings, and other functional layers. In this way, the substrate can be specifically tailored to different applications.

The first barrier stack 230 is above the polymer smoothing layer 220. The first barrier stack 230 includes a first barrier layer 235 and a first polymer layer 240. The first barrier layer 235 includes barrier layers 245 and 250. Barrier layers 245 and 250 can be made of the same barrier material or of different barrier materials.

The environmentally sensitive display device 255 is placed over the first barrier stack 230. There is a second barrier stack 260 placed over the environmentally sensitive display device 255 to encapsulate it. The second barrier stack has a barrier layer 265 and a polymer layer 270, although it can have one or more barrier layers and one or more polymer layers, as discussed above. The barrier layers and polymer layers in the first and second barrier stacks can be the same or they can be different.

Although only one first barrier stack and only one second barrier stack are shown in FIG. 2, the number of barrier stacks is not limited. The number of barrier stacks needed depends on the substrate material used and the level of permeation resistance needed for the particular application. One or two barrier stacks should provide sufficient barrier properties for some applications. The most stringent applications may require five or more barrier stacks.

There is a lid 280 over the second barrier stack 260. The lid can be can be rigid or flexible, and it can be made of the same types of materials as the substrate 205.

The method of making the encapsulated display device will be described with reference to the embodiment shown in FIG. 2. Any initial layers which are desired, such as scratch resistant layers, planarizing layers, electrically conductive layers, etc., can be coated, deposited, or otherwise placed on the substrate. A polymer smoothing layer is preferably included to provide a smooth base for the remaining layers. It can be formed by depositing a layer of polymer, for example, an acrylate-containing polymer, onto the substrate or previous layer. The polymer layer can be deposited in vacuum or by using atmospheric processes such as spin coating and/or spraying. Preferably, an acrylate-containing monomer, oligomer, or resin is deposited and then polymerized in situ to form the polymer layer. As used herein, the term acrylate-containing monomer, oligomer, or resin includes acrylate-containing monomers, oligomers, and resins, methacrylate-containing monomers, oligomers, and resins, and combinations thereof.

The first barrier stack is then placed on the substrate. The first and second barrier stacks include at least one barrier layer and at least one polymer layer. The barrier stacks are preferably made by vacuum deposition. The barrier layer can be vacuum deposited onto the polymer smoothing layer, substrate, or previous layer. The polymer layer is then deposited on the barrier layer, preferably by flash evaporating acrylate-containing monomers, oligomers, or resins, condensing on the barrier layer, and polymerizing in situ in a vacuum chamber. U.S. Pat. Nos. 5,440,446 and 5,725,909, which are incorporated herein by reference, describe methods of depositing thin film, barrier stacks.

Vacuum deposition includes flash evaporation of acrylate-containing monomer, oligomer, or resin with in situ polymerization under vacuum, plasma deposition and polymerization of acrylate-containing monomer, oligomer, or resin, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

In order to protect the integrity of the barrier layer, the formation of defects and/or microcracks in the deposited layer subsequent to deposition and prior to downstream processing should be avoided. The encapsulated display device is preferably manufactured so that the barrier layers are not directly contacted by any equipment, such as rollers in a web coating system, to avoid defects that may be caused by abrasion over a roll or roller. This can be accomplished by designing the deposition system such that the barrier layers are always covered by polymer layers prior to contacting or touching any handling equipment.

The environmentally sensitive display device is then placed on the first barrier layer. The environmentally sensitive display device can be placed on the substrate by deposition, such as vacuum deposition. Alternatively it can be placed on the substrate by lamination. The lamination can use an adhesive, glue, or the like, or heat to seal the environmentally sensitive display device to the substrate.

The second barrier stack is then placed over the environmentally sensitive display device to encapsulate it. The second barrier stack can be placed over the environmentally sensitive display device by deposition or lamination.

The barrier layers in the first and second barrier stacks may be any barrier material. The barrier layers in the first and second barrier stacks can be made of the same material or a different material. In addition, multiple barrier layers of the same or different barrier materials can be used in a barrier stack.

When a liquid device, such as a liquid crystal display or an electrophoretic ink, is used, the barrier layers (and any other layers desired) are deposited on the substrates. The edges of the substrates are then sealed leaving a space between them, and an opening is left in the seal. The liquid is introduced into the opening in the seal, and the opening is sealed, producing the device.

The barrier layers can be transparent or opaque, depending on the design and application of the display device. Preferred transparent barrier materials include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal carbides are preferably boron carbide, tungsten carbide, silicon carbide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof. The metal oxyborides are preferably zirconium oxyboride, titanium oxyboride, and combinations thereof.

For most devices, only one side of the device must be transparent. Therefore, opaque barrier layers can be used in some barrier stacks depending on the design of the display device. Opaque barrier materials include, but are not limited to, metal, ceramic, polymers, and cermets. Examples of opaque cermets include, but are not limited to, zirconium nitride, titanium nitride, hafnium nitride, tantalum nitride, niobium nitride, tungsten disilicide, titanium diboride, and zirconium diboride.

The polymer layers of the first and second barrier stacks are preferably acrylate-containing monomers, oligomers, or resins. The polymer layers in the first and second barrier stacks can be the same or different. In addition, the polymer layers within each barrier stack can be the same or different.

In a preferred embodiment, the barrier stack includes a polymer layer and two barrier layers. The two barrier layers can be made from the same barrier material or from different barrier materials. The thickness of each barrier layer in this embodiment is about one half the thickness of the single barrier layer, or about 50 to 200 Å. There are no limitations on the thickness, however.

When the barrier layers are made of the same material, they can be deposited either by sequential deposition using two sources or by the same source using two passes. If two deposition sources are used, deposition conditions can be different for each source, leading to differences in microstructure and defect dimensions. Any type of deposition source can be used. Different types of deposition processes, such as magnetron sputtering and electron beam evaporation, can be used to deposit the two barrier layers.

The microstructures of the two barrier layers are mismatched as a result of the differing deposition sources/parameters. The barrier layers can even have different crystal structure. For example, $Al_2O_3$ can exist in different phases (alpha, gamma) with different crystal orientations. The mismatched microstructure can help decouple defects in the adjacent barrier layers, enhancing the tortuous path for gases and water vapor permeation.

When the barrier layers are made of different materials, two deposition sources are needed. This can be accomplished by a variety of techniques. For example, if the materials are deposited by sputtering, sputtering targets of different compositions could be used to obtain thin films of different compositions. Alternatively, two sputtering targets of the same composition could be used but with different reactive gases. Two different types of deposition sources could also be used. In this arrangement, the lattices of the two layers are even more mismatched by the different microstructures and lattice parameters of the two materials.

A single pass, roll-to-roll, vacuum deposition of a three layer combination on a PET substrate, i.e., PET substrate/polymer layer/barrier layer/polymer layer, can be more than five orders of magnitude less permeable to oxygen and water vapor than a single oxide layer on PET alone. See J. D. Affinito, M. E. Gross, C. A. Coronado, G. L. Graff, E. N. Greenwell, and P. M. Martin, *Polymer-Oxide Transparent Barrier Layers Produced Using PML Process*, 39$^{th}$ Annual Technical Conference Proceedings of the Society of Vacuum Coaters, Vacuum Web Coating Session, 1996, pages 392–397; J. D. Affinito, S. Eufinger, M. E. Gross, G. L. Graff, and P. M. Martin, *PML/Oxide/PML Barrier Layer*

Performance Differences Arising from Use of UV or Electron Beam Polymerization of the PML Layers, Thin Solid Films, Vol. 308, 1997, pages 19–25. This is in spite of the fact that the effect on the permeation rate of the polymer multilayers (PML) layers alone, without the barrier layer (oxide, metal, nitride, oxynitride) layer, is barely measurable. It is believed that the improvement in barrier properties is due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In the single pass, polymer/barrier/polymer process, the first acrylic layer planarizes the substrate and provides an ideal surface for subsequent deposition of the inorganic barrier thin film. The second polymer layer provides a robust "protective" film that minimizes damage to the barrier layer and also planarizes the structure for subsequent barrier layer (or environmentally sensitive display device) deposition. The intermediate polymer layers also decouple defects that exist in adjacent inorganic barrier layers, thus creating a tortuous path for gas diffusion.

The permeability of the barrier stacks used in the present invention is shown in Table 1. The barrier stacks of the present invention on polymeric substrates, such as PET, have measured oxygen transmission rate (OTR) and water vapor transmission rate (WVTR) values well below the detection limits of current industrial instrumentation used for permeation measurements (Mocon OxTran 2/20 L and Permatran). Table 1 shows the OTR and WVTR value (measured according to ASTM F 1927-98 and ASTM F 1249-90, respectively) measured at Mocon (Minneapolis, Minn.) for several barrier stacks on 7 mil PET along with reported values for other materials.

TABLE 1

| Sample | Oxygen Permeation Rate ($cc/m^2/day$) | | Water Vapor Permeation ($g/m^2/day$)[+] | |
|---|---|---|---|---|
| | 23° C. | 38° C. | 23° C. | 38° C. |
| Native 7 mil PET | 7.62 | — | — | — |
| 1-barrier stack | <0.005 | <0.005* | — | 0.46[+] |
| 1-barrier stack with ITO | <0.005 | <0.005* | — | 0.011[+] |
| 2-barrier stacks | <0.005 | <0.005* | — | <0.005[+] |
| 2-barrier stacks with ITO | <0.005 | <0.005* | — | <0.005[+] |
| 5-barrier stacks | <0.005 | <0.005* | — | <0.005[+] |
| 5-barrier stacks with ITO | <0.005 | <0.005* | — | <0.005[+] |
| DuPont film[1] ($PET/Si_3N_4$ or $PEN/Si_3N_4$) | 0.3 | — | — | — |
| Polaroid film[3] | <1.0 | — | — | — |
| PET/Al[2] | 0.6 | — | 0.17 | — |
| PET/silicon oxide[2] | 0.7–1.5 | — | 0.15–0.9 | — |
| Teijin LCD film (HA grade - TN/STN)[3] | <2 | — | <5 | — |

*38° C., 90% RH, 100% $O_2$
[+]38° C., 100% RH
[1]P. F. Carcia, 46th International Symposium of the American Vacuum society, October 1999
[2]Langowski, H. C., 39th Annual Technical Conference Proceedings, SVC, pp. 398–401 (1996)
[3]Technical Data Sheet As the data in Table 1 shows, the barrier stacks of the present invention provide oxygen and water vapor permeation rates several orders of magnitude better than PET coated with aluminum, silicon oxide, or aluminum oxide. The barrier stacks are extremely effective in preventing oxygen and water penetration to the underlying components, substantially outperforming other barrier coatings on the market.

The preferred deposition process is compatible with a wide variety of substrates. Because the preferred process involves flash evaporation of a monomer and magnetron sputtering, deposition temperatures are well below 100° C., and stresses in the coating can be minimized. Multilayer coatings can be deposited at high deposition rates. No harsh gases or chemicals are used, and the process can be scaled up to large substrates and wide webs. The barrier properties of the coating can be tailored to the application by controlling the number of layers, the materials, and the layer design. Thus, the present invention provides a barrier stack with the exceptional barrier properties necessary for hermetic sealing of an environmentally sensitive display device. It permits the production of an encapsulated environmentally sensitive display device.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making an encapsulated display device comprising:
   providing a first substrate having at least one barrier stack thereon, the first substrate having an edge, the at least one barrier stack comprising at least one first barrier layer and at least one first polymer layer, wherein an oxygen transmission rate through the at least one first barrier stack is less than 0.005 $cc/m^2$/day at 23° C. and 0% relative humidity;
   providing a second substrate, the second substrate having an edge;
   placing the first substrate next to the second substrate so that there is a space between the first and second substrate,
   forming a seal between the edge of the first substrate and the edge of the second substrate, the seal having an opening therein;
   introducing a liquid into the space between the first and second substrate through the opening in the seal, the liquid selected from liquid crystals and electrophoretic inks; and
   closing the opening in the seal to form the encapsulated display device.

2. The method of claim 1 wherein providing a first substrate having at least one barrier stack thereon comprises depositing the at least one first barrier stack adjacent to the first substrate.

3. The method of claim 2 wherein the at least one first barrier stack is vacuum deposited.

4. The method of claim 2 wherein the at least one first barrier layer is vacuum deposited and the at least one first polymer layer is deposited.

5. The method of claim 1 wherein providing a first substrate having at least one barrier stack thereon comprises laminating the at least one first barrier stack adjacent to the first substrate.

6. The method of claim 5 wherein the at least one first barrier stack is laminated using an adhesive.

7. The method of claim 5 wherein the at least one first barrier stack is laminated using heat.

8. The method of claim 5 wherein the at least one first barrier stack is laminated using solder.

9. The method of claim 5 wherein the at least one first barrier stack is laminated using pressure.

10. The method of claim 5 wherein the at least one first barrier stack is laminated using ultrasonic welding.

11. The method of claim 1 further comprising placing at least one second barrier stack comprising at least one second barrier layer and at least one second polymer layer adjacent to the second substrate before forming the seal between the edge of the first substrate and the edge of the second substrate.

12. The method of claim 11 wherein placing the at least one second barrier stack adjacent to the second substrate comprises depositing the at least one second barrier stack adjacent to the second substrate.

13. The method of claim 12 wherein the at least on second barrier stack is vacuum deposited.

14. The method of claim 12 wherein the at least one second barrer layer is vacuum depodited and the at least one second polymer layer is deposited.

15. The method of claim 11 wherein the at least one second barrier layer comprises two barrier layers.

16. The method of claim 11 wherein placing the at least one second barrier stack adjacent to the second substrate comprises laminating the at least one second barrier stack adjacent to the second substrate.

17. The method of claim 16 wherein the at least one second barrier stack is laminated using a process selected from adhesive, heat, solder, pressure, ultrasonic welding.

18. The method of claim 1 wherein the at least one first barrier layer comprises two barrier layers.

19. The method of claim 18 wherein the two barrier layers are deposited using the same deposition source.

20. The method of claim 18 wherein the two barrier layers are deposited using different deposition sources.

21. The method of claim 18 wherein the two barriers layers are vacuum deposited.

22. The method of claim 18 wherein the two barrier layers are made of the same barrier material.

23. The method of claim 18 wherein the two barrier layers are made of different barrier materials.

24. A method of making an encapsulated display device comprising:
    providing a substrate having an environmentally sensitive display device therein; and
    laminating at least one first barrier stack comprising at least one first barrier layer and at least one first polymer layer over the environmentally sensitive display device using solder to encapsulate the environmentally sensitive display device.

25. A method of making an encapsulated display device comprising:
    providing a substrate;
    placing a second barrier stack comprising at least one second barrier layer and at least one second polymer layer adjacent to the substrate;
    placing an environmentally sensitive display device adjacent to the second barrier stack; and
    placing at least one first barrier stack comprising at least one first barrier layer and at least one first polymer layer over the environmentally sensitive display device to encapsulate the environmentally sensitive display device; and
    removing the substrate from the encapsulated environmentally sensitive display device.

* * * * *

UNITED STATES PATENT AND TRADEMARK OFFICE
CERTIFICATE OF CORRECTION

PATENT NO. : 6,923,702 B2 Page 1 of 1
APPLICATION NO. : 10/318759
DATED : August 2, 2005
INVENTOR(S) : Graff et al.

It is certified that error appears in the above-identified patent and that said Letters Patent is hereby corrected as shown below:

Col. 4, Line 45, "lid can be can be" should be --lid can be--
Col. 4, Line 60, "in situ" should read --*in situ*--
Col. 5, Line 6, "in situ" should read --*in situ*--
Col. 5, Line 11, "in situ" should read --*in situ*--
Col. 6, Lines 63-64, "*Polymer-Oxide Transparent Barrier Layers Produced Using PML Process,*" should read -- Polymer-Oxide Transparent Barrier Layers Produced Using PML Process,--
Col. 6, Lines 67, "*PML/Oxide/PML, Barrier Layer*" should read --PML/Oxide/PML, Barrier Layer--
Col. 7, Lines 1&2, "*Performance Differences Arising from Use of UV or Electron Beam Polymerization of the PML, Layers*" should read --Performance Differences Arising from Use of UV or Electron Beam Polymerization of the PML, Layers
Col. 7, Line 38, "Minn.)" should read --MN--
Col. 7, Line 58, "*38°C" should read --(*)38°C--
Col. 7, Line 59, "+38°C" should read --(+)38°C--
Col. 7, Line 60, "¹P.F." should read --1 - P.F.--
Col. 7, Line 61, "²Langowski, should read --2 - Langowski--
Col. 7, Line 62, "³Technical" should read --3 - Technical--
Col. 9, Line 17, "least on" should read --least one--
Col. 9, Line 24, "claim 11" should read --claim 15--
Col. 10, Line 12, "device therein" should read --device thereon--

Signed and Sealed this

Twenty-fifth Day of July, 2006

JON W. DUDAS
*Director of the United States Patent and Trademark Office*